(12) United States Patent
Foong et al.

(10) Patent No.: US 9,159,682 B2
(45) Date of Patent: Oct. 13, 2015

(54) COPPER PILLAR BUMP AND FLIP CHIP PACKAGE USING SAME

(71) Applicants: Chee Seng Foong, Sg Buloh (MY); Boon Yew Low, Petaling Jaya (MY); Navas Khan Oratti Kalandar, Petaling Jaya (MY)

(72) Inventors: Chee Seng Foong, Sg Buloh (MY); Boon Yew Low, Petaling Jaya (MY); Navas Khan Oratti Kalandar, Petaling Jaya (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 53 days.

(21) Appl. No.: 14/020,841

(22) Filed: Sep. 8, 2013

(65) Prior Publication Data

US 2015/0069603 A1 Mar. 12, 2015

(51) Int. Cl.
*H01L 21/44* (2006.01)
*H01L 23/00* (2006.01)
*H01L 23/498* (2006.01)

(52) U.S. Cl.
CPC .......... *H01L 24/11* (2013.01); *H01L 23/49811* (2013.01); *H01L 23/49816* (2013.01); *H01L 23/49822* (2013.01); *H01L 24/03* (2013.01); *H01L 24/05* (2013.01); *H01L 24/13* (2013.01); *H01L 24/16* (2013.01); *H01L 24/32* (2013.01); *H01L 24/81* (2013.01); *H01L 24/83* (2013.01); *H01L 24/92* (2013.01); *H01L 2224/03424* (2013.01); *H01L 2224/03464* (2013.01); *H01L 2224/0401* (2013.01); *H01L 2224/05155* (2013.01); *H01L 2224/05644* (2013.01); *H01L 2224/10175* (2013.01); *H01L 2224/1147* (2013.01); *H01L 2224/1148* (2013.01); *H01L 2224/11462* (2013.01); *H01L 2224/11474* (2013.01); *H01L 2224/11849* (2013.01); *H01L 2224/13147* (2013.01); *H01L 2224/14131* (2013.01); *H01L 2224/16227* (2013.01); *H01L 2224/32225* (2013.01); *H01L 2224/73204* (2013.01); *H01L 2224/8121* (2013.01); *H01L 2224/81192* (2013.01); *H01L 2224/81203* (2013.01); *H01L 2224/81815* (2013.01); *H01L 2224/83102* (2013.01); *H01L 2224/9211* (2013.01); *H01L 2224/92125* (2013.01); *H01L 2924/01029* (2013.01); *H01L 2924/15311* (2013.01)

(58) Field of Classification Search
CPC .................................. H01L 24/81; H01L 24/11
USPC .......................................................... 438/613
See application file for complete search history.

(56) References Cited

U.S. PATENT DOCUMENTS

| | | | |
|---|---|---|---|
| 5,790,377 A | 8/1998 | Screiber | |
| 7,208,834 B2 | 4/2007 | Lee | |
| 7,462,942 B2 | 12/2008 | Tan | |
| 7,790,597 B2 | 9/2010 | Chauhan | |
| 2005/0009289 A1* | 1/2005 | Lo | 438/411 |
| 2006/0279000 A1* | 12/2006 | Chang et al. | 257/779 |
| 2011/0027943 A1* | 2/2011 | Gurrum et al. | 438/122 |
| 2011/0169170 A1* | 7/2011 | Baba et al. | 257/774 |
| 2012/0211464 A1 | 8/2012 | An | |
| 2012/0280388 A1 | 11/2012 | Wu | |
| 2012/0306080 A1 | 12/2012 | Yu | |

* cited by examiner

*Primary Examiner* — Ajay K Arora
(74) *Attorney, Agent, or Firm* — Charles Bergere

(57) ABSTRACT

Electrically conductive pillars with a solder cap are formed on a substrate with an electroplating process. A flip-chip die having solder wettable pads is attached to the substrate with the conductive pillars contacting the solder wettable pads.

9 Claims, 4 Drawing Sheets

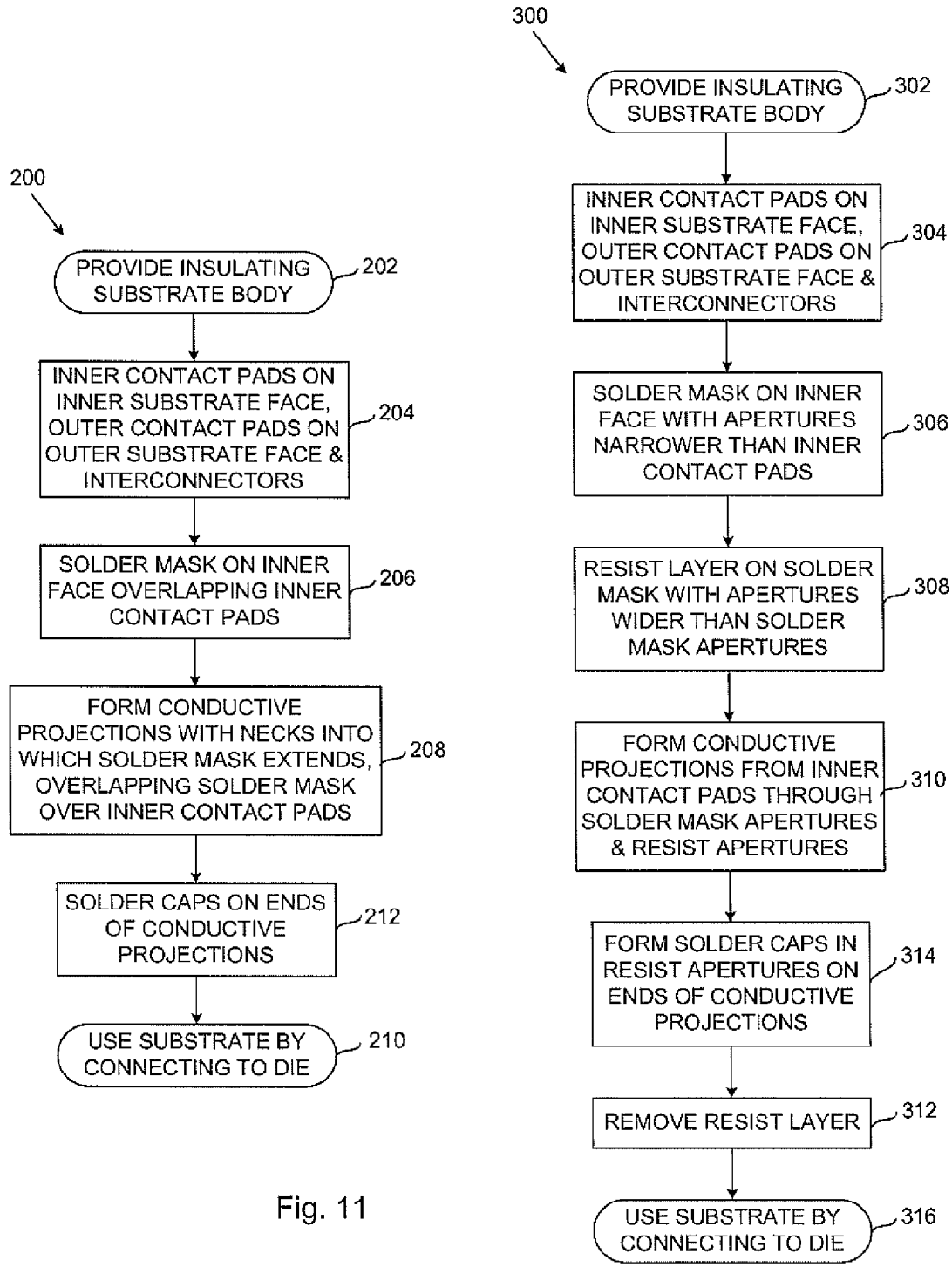

COPPER PILLAR BUMP AND FLIP CHIP PACKAGE USING SAME

BACKGROUND OF THE INVENTION

The present invention is directed to semiconductor device packaging and, more particularly, to a flip chip die package having a copper pillar bumps interconnecting the die to a substrate.

Semiconductor device packaging fulfills basic functions such as providing electric connections and protecting the die against mechanical and environmental stresses. Continued progress in reduction of the size of the semiconductor dies and increased functionality and complexity of the electronic circuits integrated in the dies require size reduction of the packaging with the same or greater complexity of the electrical connections with external circuits.

Semiconductor devices are commonly packaged for surface mounting by encapsulating one or more semiconductor dies in an epoxy mould compound. Exposed electrical contacts for connection with external circuits are supported by the package and connected internally with electrical contact pads on the semiconductor die. Various techniques are available for connecting internally the exposed electrical contacts of the package with the embedded semiconductor die.

In a flip chip device, a die is mounted with its active face on a substrate, where conductive bumps formed on the die bonding pads are mated with contact pads on the substrate. The substrate includes wiring patterns and vias to route the electrical connections with the die to the external contacts on the opposite side of the substrate.

The bonding pads on the active face of the semiconductor die (or chip) may be metalized and solder balls applied to the contact pads, typically on the wafer, before the die is singulated (separated from adjacent dies). The singulated, bumped die is placed with its active face on the substrate and the then the solder bumps are re-melted, typically using an ultrasonic or alternatively a reflow solder process to establish the electrical connections. A minimum spacing of the solder balls is required to avoid risk of short circuits. A finer pitch and spacing of the die pads can be obtained using metal (for example copper) pillars or studs, with solder caps, which are grown on the die bonding pads. Conventionally, the pillars and solder caps are formed on the wafers before singulation of the dies. However, this process is very complicated and expensive.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Vertical and horizontal scales may be disproportionate.

FIGS. 11 and 12 are flow charts of methods of forming of a substrate of the kind illustrated in FIGS. 3 to 10, in accordance with embodiments of the present invention.

DETAILED DESCRIPTION OF THE INVENTION

Figure 1:
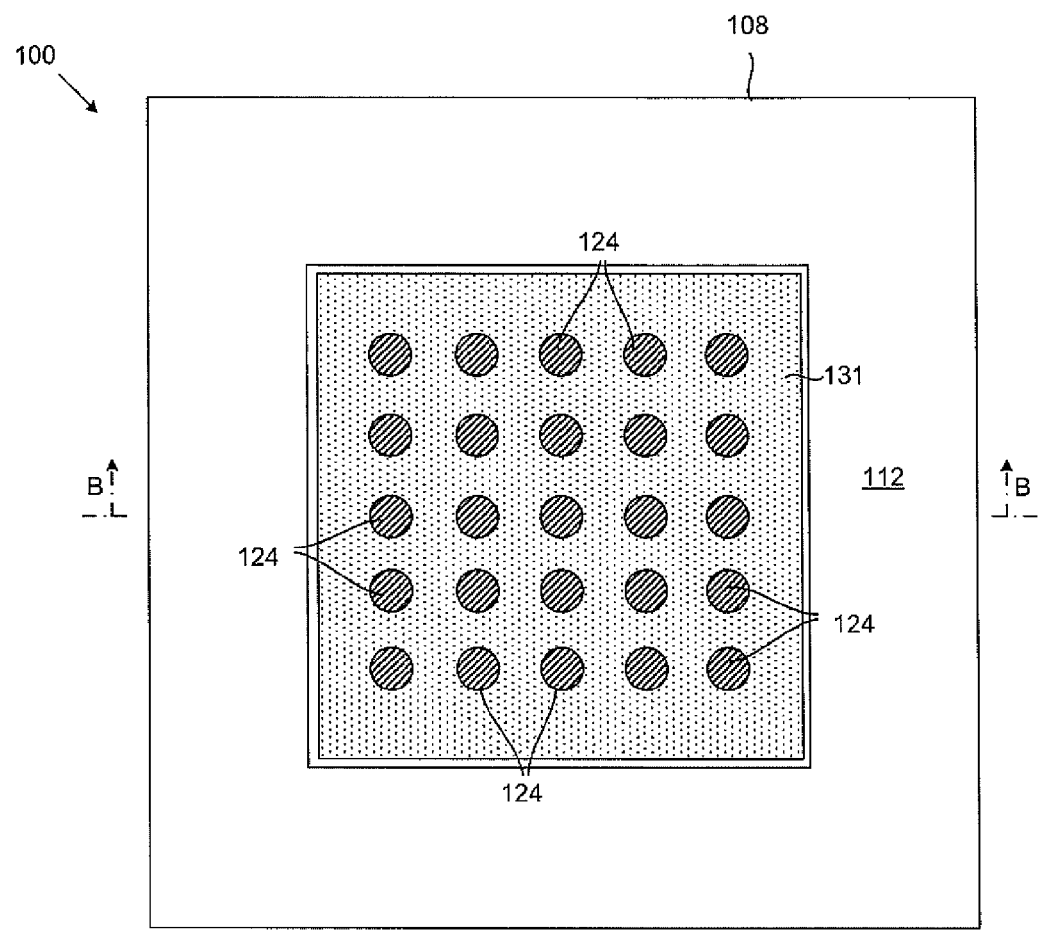
FIG. 1 is a schematic sectional view of a substrate based semiconductor device along line A-A of FIG. 2, in accordance with an embodiment of the present invention.
Figure 2:
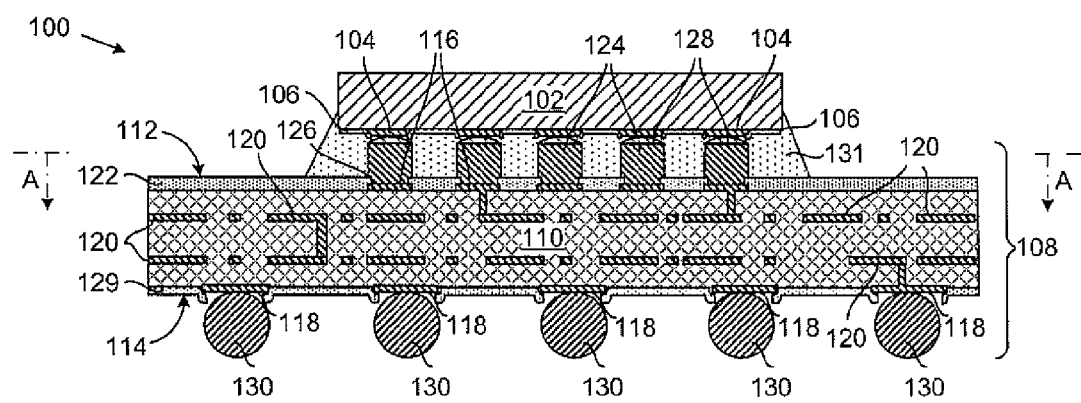
FIG. 2 is a cross-sectional view of the semiconductor device of FIG. 1 along line B-B of FIG. 1.

Referring now to FIGS. 1 and 2, an example of a flip-chip type semiconductor device 100 in accordance with an embodiment of the present invention is shown. The semiconductor device 100 comprises at least one semiconductor die 102 having an active face having die bonding pads 104. Typically, the semiconductor die 102 has been singulated from an array of dies processed on a wafer. The semiconductor die 102 may contain integrated circuits (ICs) including various electrical and electronic circuit elements such as transistors, impedances, memory elements, sensors and micro-electro-mechanical systems (MEMS), for example. A passivation (or a solder mask) layer 106 may overlie the active face of the semiconductor die 102 between the die bonding pads 104.

The semiconductor device 100 also includes a substrate 108. The substrate 108 has a body 110 of insulating material with an inner face 112 and an outer face 114. The substrate 108 has inner contact pads 116 at the inner face 112 and outer contact pads 118 at the outer face 114. The inner contact pads 116 are for electrical connection with the die bonding pads 104 and the outer contact pads 118 are for external electrical connection. The substrate 108 can also have metal layers and/or vias 120 embedded in the body 110 of insulating material to interconnect the contact pads 116 and 118, as is known in the art. A solder mask layer 122 of insulating material overlies the inner face 112 between the inner contact pads 116 and overlaps the inner contact pads 116.

The substrate 108 also has a set of electrically conductive projections or pillars 124 that project from the from the inner contact pads 116. The pillars 124 have necks 126 at the inner face 112 into which the solder mask layer 122 extends. The pillars 124 overlap the solder mask layer 122 over the outer contact pads 118. The pillars 124 also preferably include solder caps 128 that connect the pillars 124 with the die bonding pads 104. Thus, the pillars 124 are formed on and extend from the inner contact pads 116 of the substrate 108, and connect to the die bonding pads 104. The necks 126 in the pillars 124, with the pillars 124 overlapping the solder mask layer 122 over the inner contact pads 116, offer good interfacial integrity and protection. The pillars 124 may have a high aspect ratio (height to width) and close pitch. Risk of solder bridging is reduced by the solder mask layers 106 and 122 and the absence of solder caps at the inner face of the substrate 108.

The die bonding pads 104 preferably have a solder-wettable coating, such as an electro-less nickel with immersion gold coating (ENIG) for example. In the substrate 108, a solder mask layer 129 may overlie the outer face 114 of the substrate 108 between the outer contact pads 118. External solder elements such as conductive balls 130 for connection to an external electrical circuit such as a PCB may be attached to the outer contact pads 118 by adhesive flux, for example. The device 100 also may include an adhesive 131 to attach the die 102 to the inner face 112 of the substrate 108. The adhesive 131 may be applied either before the die 102 is positioned on the substrate 108, or after such as by capillary under fill.

A method of assembling the semiconductor device 100 includes providing the flip chip semiconductor die 102, providing the substrate 108, forming the pillars 124 on the substrate 108, and then attaching the die 102 to the substrate 108 and at the same time connecting the pillars 124 with the die bonding pads 104. In this method, the substrate 108 may be made and sourced independently of fabrication of the semiconductor die 102. In particular, the pillars 124 and the solder caps 128 may be produced during production of the substrate 108. No operations of growing the pillars 124 and the solder caps 128 must be performed on a semiconductor wafer during fabrication of the semiconductor die 102, avoiding complications in manufacturing and sourcing of the semiconductor die 102. That is, today, flip chip dies are fabricated and the bumps or pillars are formed on the die bonding pads bumped by the semiconductor fabrication facility (a.k.a. fab). However, according to the present invention, the pillars are formed on the substrate so the die 102 does not need to be bumped at the fab, thus saving on costly processes performed at the fab. Connecting the pillars 124 with the die bonding pads 104 may include positioning the semiconductor die 102 with the solder caps 128 contacting the die bonding pads 104 and causing the solder caps 128 to reflow. Suitable techniques such as thermo-compression bonding or mass reflow bonding may be used to connect the solder caps 128 with the die bonding pads 104. The adhesive 131 may be introduced between the active face of the semiconductor die 102 and the inner face 112 of the substrate 108 either before the die 102 is positioned on the substrate 108, or after. Assembling the semiconductor device 100 may include encapsulating the semiconductor die 102 in a molding compound (not shown).

An example of a method 200 of making the substrate 108 for a semiconductor device such as the device 100 comprising at least one singulated flip chip semiconductor die 102 with die bonding pads 104 at an active surface of the semiconductor die 102 is illustrated in FIGS. 3 to 10 and 11.

The method 200 comprises providing at step 202 a substrate body 110 of insulating material having inner and outer faces 112 and 114. At step 204, the inner contact pads 116 are provided at the substrate inner face 112, and the substrate outer contact pads 118 are provided at the substrate outer face 114. The substrate body 110 may include insulating material and metal (layers and/or vias) 120 embedded in the insulating material that interconnect the inner and outer contact pads 116 and 118. At step 206, a solder mask layer 122 is provided overlying the inner face 112 between the inner contact pads 116. Electrically conductive pillars 124 are formed through the solder mask layer 122 on the inner contact pads 116 at step 208. The pillars 124 have necks 126 at the inner face 112 that extend into the solder mask layer 122. The pillars 124 overlap the solder mask layer 122 over the inner contact pads 116. Forming the solder mask layer 122 on the inner face 112 before the electrically conductive pillars 124 are formed facilitates ensuring that the solder mask layer 122 is level and has a uniform thickness. Forming the solder mask layer 122 on the inner face 112 after the pillars 124 are formed risks excessive thickness of the solder mask in places due to capillary effects on the sides of the pillars 124 while leaving traces of the interconnectors 120 exposed. The finished substrate 108 can be supplied, at step 210, for use in assembling a surface mount semiconductor device such as the device 100 by attaching a die 102 to the substrate 108 and connecting the pillars 124 with the die bonding pads 104.

The method 200 may include at step 212 providing solder caps 128 at the outer ends of the pillars 124, remote from the substrate inner face 112 to facilitate connecting the pillars 124 with the die bonding pads 104.

Figure 8:
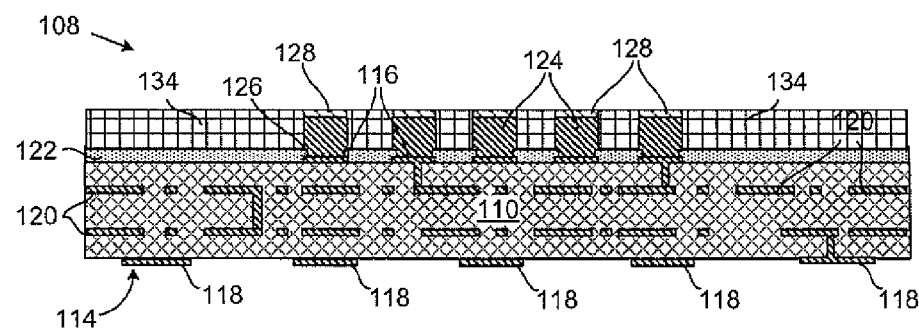
Figure 9:
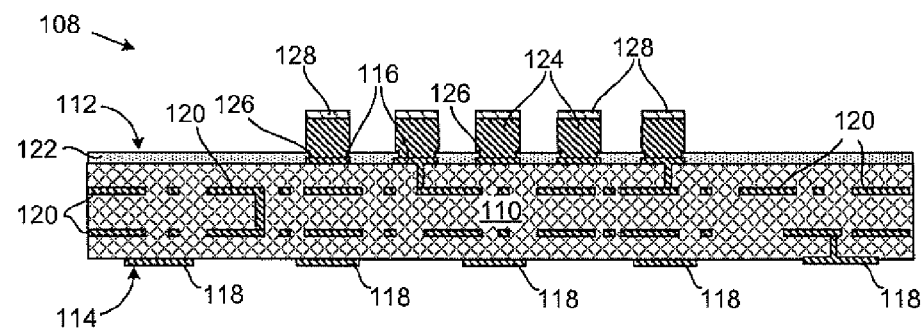
Figure 10:
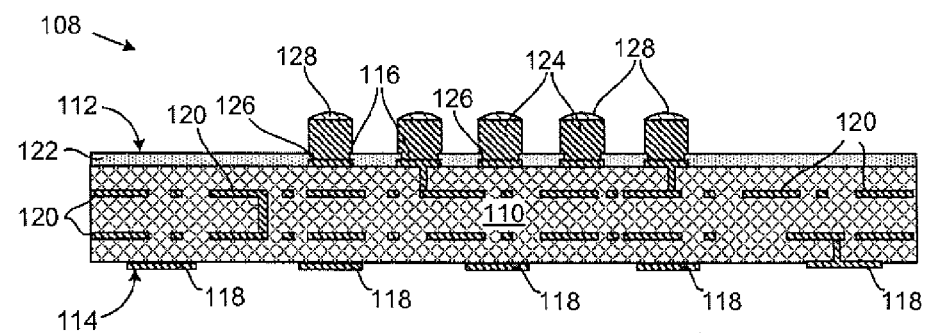

FIGS. 3 to 10 and 12 illustrate another example of a method 300 of making the substrate 108. The method 300 comprises providing, at step 302, the body 110 of insulating material presenting inner and outer faces 112 and 114. At step 304, substrate inner contact pads 116 are provided at the inner face 112, and substrate outer contact pads 118 are provided at the outer face 114. The body 110 of insulating material includes interconnectors 120 (metal and vias forming redistribution layers, as is known in the art) embedded in the insulating material interconnecting the inner and outer contact pads 116 and 118. At step 306, a solder mask layer 122 of insulating material is provided overlying the inner face 112 between the inner contact pads 116. The solder mask layer 122 has apertures 132 over the inner contact pads 116 that are narrower than the inner contact pads 116. At step 308, a resist layer 134 (FIG. 6) is formed covering the solder mask layer 122, the resist layer 134 having apertures 136 over the inner contact pads 116. The pillars 124 are formed through the solder mask layer 122 on the inner contact pads 116 at step 310, within the apertures 132 of the solder mask layer 122 and the apertures 136 of the resist layer 134 (see FIG. 7). At 314, solder caps 128 are formed (see FIG. 8) for connecting the pillars 124 with the die bonding pads 104. The solder caps 128 are formed within the apertures 136 of the resist layer 134 on ends of the electrically conductive pillars 124 remote from the inner face 112. The resist layer 134 is removed at step 312 (FIG. 9).

The apertures 136 of the resist layer 134 may be wider than the apertures 132 of the solder mask layer 122 and the electrically conductive pillars 124 may have necks 126 at the inner face 112, into which extends the solder mask layer 122. In a preferred embodiment, forming the pillars 124 through the solder mask layer 122 includes growing the pillars 124 electrolytically within the apertures 132 of the solder mask layer 122 and the apertures 136 of the resist layer 134. The solder caps 128 also may be grown electrolytically within the apertures 136 of the resist layer 134. This technique enables the solder caps 128 to be produced in a single photo resist step. Again, the finished substrate 108 can be supplied, for use at step 316 in making a surface mount semiconductor device such as the device 100 attaching a die 102 to the substrate 108 and connecting the pillars 124 to the die bonding pads 104 by way of the solder caps 128. A substantial cost saving can be achieved by assembling the device 100 in this way, compared to forming electrically conductive pillars with solder caps on the active face of a wafer with an array of semiconductor dies, since with the present invention, under bump metallization (UBM) is no longer being needed on the wafer.

Figure 3:
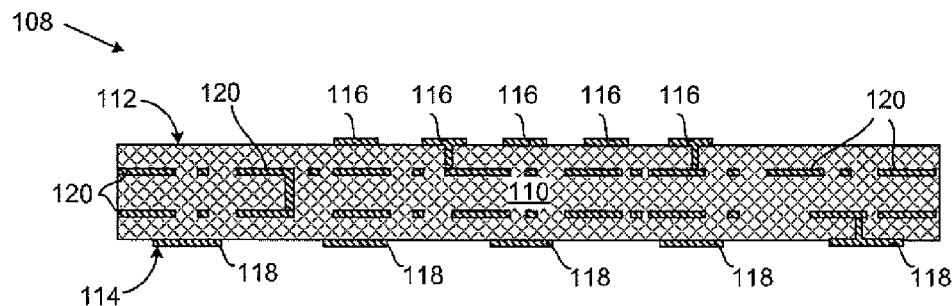
FIGS. 3 to 10 are sectional views illustrating various steps in the formation of conductive pillars on a substrate in accordance with an embodiment of the present invention.

FIGS. 3 to 10 illustrate the manufacture of the substrate 108 in more detail. FIG. 3 illustrates the body 110 of insulating material with interconnectors 120, including traces and vias, connecting the inner contact pads 116 to the outer contact pads 118. The structure illustrated in FIG. 3 may be made in successive operations of lamination and electro-plating or electro-deposition, for example.

Figure 4:
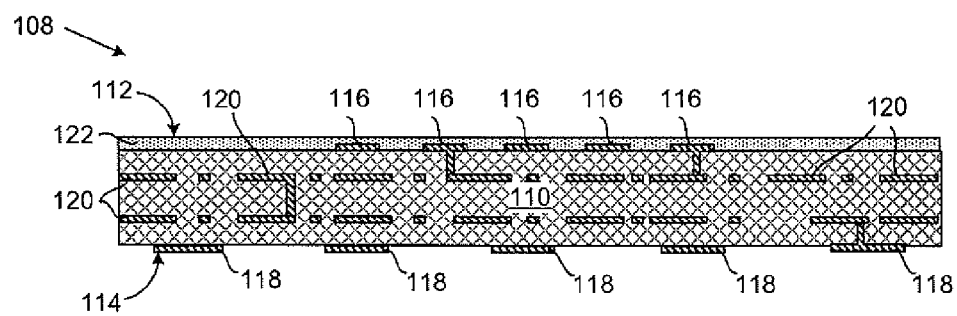
Figure 5:
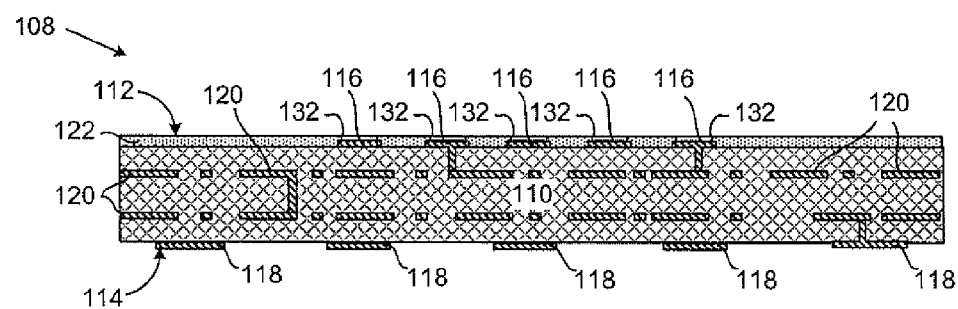

FIG. 4 shows the solder mask 122 coated over the inner face 112 of the body 110 and the inner contact pads 116. The apertures 132 are then opened in the solder mask 122 (FIG. 5), for example by selective etching, the widths of the apertures 132 being less than the widths of the inner contact pads 116 so that the solder mask 112 overlaps the edges of the inner contact pads 116.

Figure 6:
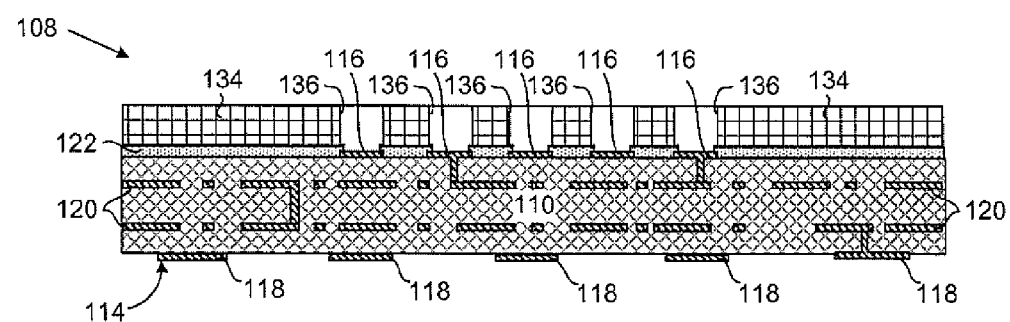
Figure 7:
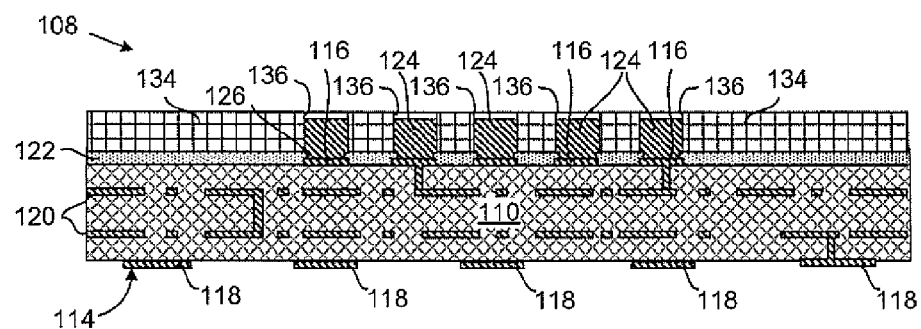

As shown in FIG. 6, the layer 134 of photo-resist is coated over the substrate inner face 112 and the apertures 136 are opened in the photo-resist over the solder mask apertures 132 and the contact pads 116, such as by selectively exposing and etching the photo-resist 134. Preferably, the widths of the photo-resist apertures 136 are greater than the widths of the solder mask apertures 132 and in this example are equal to the widths of the contact pads 116 of the inner set.

The pillars 124 are then formed electrolytically through the solder mask layer 122 on the inner contact pads 116 (FIG. 7), within the apertures 132 of the solder mask layer 122 and the apertures 136 of the resist layer 134, for example by electro-deposition. Because of the different widths of the photo-resist apertures 136, the solder mask apertures 132 and the contact pads 116, the pillars 124 have necks 126 at the inner face 112, into which extends the solder mask layer 122 and the electrically conductive pillars 124 overlap onto the solder mask layer 122 over the contact pads 116. The pillars 124 preferably are formed of copper. In one example, the pillars 124 were formed of copper with an electroplating process. The pillars 124 had a high aspect ratio, i.e., 50 um height by 50 um diameter.

As shown in FIG. 8, using the same photo-resist apertures 136, the solder caps 128 are then grown electrolytically on the exposed outer ends of the pillars 124 for example by electroplating or electro-deposition.

The photo-resist layer 134 is then removed, as shown in FIG. 9, and the substrate is then subjected to a low temperature bake to reflow the solder caps 128. A solder mask layer 132 may be formed on the substrate outer face 114 at a suitable stage in the process. The conductive balls 130 may be attached to the substrate outer contact pads 118, for example by adhesive flux after mounting the die 102 on the substrate 108.

In the foregoing specification, the invention has been described with reference to specific examples of embodiments of the invention. It will, however, be evident that various modifications and changes may be made therein without departing from the broader intent and scope of the invention as set forth in the appended claims.

For example, the semiconductor die described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice-versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method of assembling a semiconductor device, comprising:
    providing a substrate having a substrate body with an inner face having inner contact pads and an outer face having outer contact pads, and electrically conductive pillars that extend from the inner contact pads, wherein the step of providing the substrate includes:
        providing a body of insulating material having the body inner and outer faces;
        providing the substrate inner contact pads on the inner face of the substrate body;
        providing the substrate outer contact pads on the outer face of the substrate body;
        wherein the body of insulating material includes interconnectors embedded in the insulating material that interconnect the inner and outer contact pads;
        providing a solder mask layer overlying the inner face of the substrate between the inner contact pads, wherein the solder mask layer has apertures over the inner contact pads that are narrower than the inner contact pads;
        forming a resist layer covering the solder mask layer, the resist layer also having apertures over the inner contact pads, wherein a height of the resist layer is greater than a height of the solder mask layer;
        forming the pillars through the solder mask layer on the inner contact pads within the apertures of the solder mask layer and the apertures of the resist layer;
        forming solder caps on the remote ends of the pillars, wherein the solder caps are formed within the apertures of the resist layer; and
        removing the resist layer such that after said removing, a height of exposed portions of the pillars is greater than a height of neck portions of the pillars embedded in the solder mask layer;
    attaching an active face of a flip chip semiconductor die to the substrate inner face, wherein die bonding pads on the die active face receive the electrically conductive pillars; and
    electrically connecting the pillars with the die bonding pads.

2. The method of assembling a semiconductor device of claim 1, wherein the die bonding pads include a solder wettable layer.

3. The method of assembling a semiconductor device of claim 2, wherein an exposed surface of the die bonding pads comprises an electro-less nickel with immersion gold coating.

4. The method of assembling a semiconductor device of claim 1, wherein the step of electrically connecting the pillars with the die bonding pads includes performing a reflow process to connect the pillars to the die bonding pads.

5. The method of claim 1, further comprising the step of attaching conductive balls to the substrate outer contact pads, wherein the conductive balls allow for connection of the semiconductor device to an external electrical device.

6. The method of claim 1, wherein the pillars are formed of copper.

7. The method of claim 1, wherein said apertures of the resist layer are wider than the apertures of the solder mask layer and the pillars have necks at the inner face into which extends the solder mask layer.

8. The method of claim 1, wherein forming the pillars through the solder mask layer includes growing the pillars electrolytically within the apertures of the solder mask layer and the apertures of the resist layer.

9. The method of claim 8, wherein forming the solder caps includes growing the solder caps electrolytically within said apertures of said resist layer.

* * * * *